United States Patent [19]

Janutka

[11] Patent Number: 4,481,434
[45] Date of Patent: Nov. 6, 1984

[54] SELF REGENERATIVE FAST GATE TURN-OFF FET

[75] Inventor: William J. Janutka, West Allis, Wis.

[73] Assignee: Eaton Corporation, Cleveland, Ohio

[21] Appl. No.: 390,482

[22] Filed: Jun. 21, 1982

[51] Int. Cl.³ .................... H03K 17/04; H03K 17/087
[52] U.S. Cl. .................................... 307/570; 307/246;
307/288; 307/572; 307/581
[58] Field of Search ............... 307/499, 501, 360, 246,
307/570–572, 577, 579, 581, 584, 270, 288, 252
A, 252 C, 252 D; 357/236 P

[56] References Cited

U.S. PATENT DOCUMENTS 4,178,521 12/1979 Speth ..................................... 307/270
4,266,149 5/1981 Yoshida .......................... 307/270 X Primary Examiner—Stanley D. Miller
Assistant Examiner—David R. Hudspeth
Attorney, Agent, or Firm—Andrus, Sceales, Starke & Sawall

[57] ABSTRACT

A fast turn-off FET circuit is provided by regeneratively coupled bipolar transistors in the gate circuit of the FET which are driven into latched conduction by residual charge in the gate to source capacitance of the FET upon turn-off of the latter due to removal of gate drive. The regeneratively coupled bipolar transistors remain in latched conduction until the FET gate charge is depleted. Conduction of the bipolar transistors provides faster discharge therethrough of the FET gate, whereby to facilitate faster FET turn-off without reverse gating current and its attendant auxiliary power supply.

9 Claims, 2 Drawing Figures

SELF REGENERATIVE FAST GATE TURN-OFF FET

TECHNICAL FIELD

The invention relates to field effect transistors (FETs), and more particularly to gating circuitry facilitating fast turn-off.

BACKGROUND AND SUMMARY

Field effect transistors are well known in the art, including various gating techniques. An enhancement mode FET conducts current between its drain and source in response to gate voltage. Because of the capacitance that exists between the gate, source and drain of the FET, any change in the gate voltage is achieved only through an attendant movement of charge to and from the FET gate region. The speed with which a FET can be turned ON and OFF is dependent upon the speed with which the charge can be stored in and removed from the gate capacitance. Some gating circuits are able to supply sufficient current to charge the gate rapidly to attain fast turn-on, but must rely on a resistance connected between the gate and source of the FET to remove the gate charge for turn-off. In order to achieve fast turn-off a low value resistance must be used requiring that a high current be maintained through the gate resistance while the FET is ON, all as is known.

The present invention provides fast turn-off but without a high current required from the gate driving source.

The FET turn-off circuitry of the present invention is self-regenerative in that the gate to source capacitance of the FET is used to drive a regenerative switch into latched conduction until the residual stored charge on the FET gate is drained. Faster discharge of the FET gate is thus enabled, whereby to facilitate faster FET turn-off.

DETAILED DESCRIPTION

Figure 1:
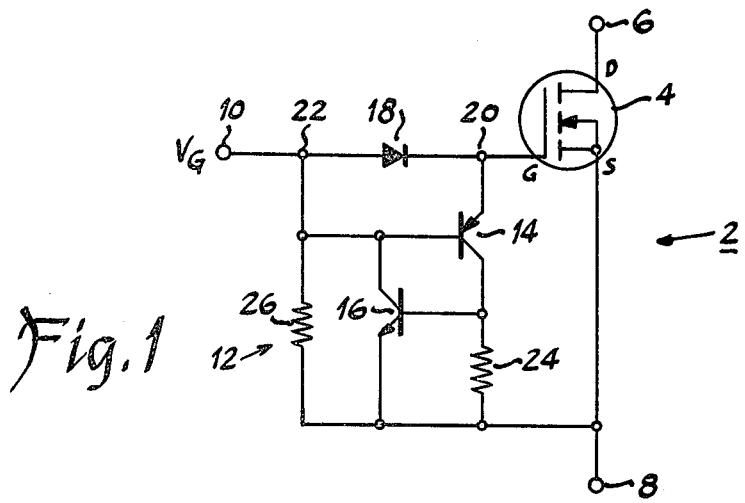
FIG. 1 is a circuit diagram of a fast turn-off FET circuit constructed in accordance with the invention.

In FIG. 1, fast turn-off FET circuit 2 includes an enhancement mode n channel FET 4, such as a MOSFET, having a drain connected to drain terminal 6 a source connected to source terminal 8 and a gate connected to gate terminal 10. Upon application of gate drive to terminal 10, for example from a gating voltage source $V_G$, FET 4 is driven into its conductive ON state to conduct current between its drain and source in a given circuit application (not shown).

Regenerative switch means 12 is connected to the FET gate and driven into latched conduction by residual stored charge in the gate to source capacitance of FET 4 upon turn-off of the latter due to removal of gate drive. The conduction of switch means 12 stays latched ON until the residual stored gate charge of the FET is depleted or drained off. Conduction of switch 12 provides faster discharge therethrough of the FET gate, whereby to facilitate faster FET turn-off.

Regenerative switch means 12 comprises regeneratively coupled transistors, such as bipolar PNP transistor 14 and bipolar NPN transistor 16. A diode 18 has its anode connected to gate terminal 10 and its cathode connected to the FET gate. The emitter of bi-polar transistor 14 is connected to a point 20 between diode 18 and the FET gate. The base of transistor 14 is connected to the collector of transistor 16 and each is connected in common to a point 22 between gate terminal 10 and diode 18. The collector of transistor 14 is connected to the base of transistor 16 and is also connected through a resistor 24 to source terminal 8. The emitter of transistor 16 is connected to source terminal 8. A resistor 26 is connected between the base of transistor 14 and source terminal 8.

Upon application of gate drive at terminal 10, diode 18 becomes forward biased and the emitter-base junction of transistor 14 becomes reverse biased. The voltage on the gate of FET 4 rises, turning the latter ON. When gate drive at terminal 10 is removed, diode 18 becomes reverse biased and the emitter-base junction of transistor 14 becomes forward biased, rendering the latter conductive.

The forward biasing of the base-emitter junction of transistor 14 is effected by the residual stored charge in the gate to source capacitance of FET 4. Resistor 26 provides a return path back to source terminal 8 for the forward current flow across the base-emitter junction of transistor 14. Since diode 18 is reverse biased at turn-off, it blocks current flow therethrough between the FET gate and the base of transistor 14 and thus insures biasing of transistor 14 into conduction.

Conduction of transistor 14 supplies base drive to transistor 16 whose conduction in turn draws base current from transistor 14 to thus complete a regenerative loop therebetween. This loop stays conductive until the charge on the FET gate is drained. The result is a fast turn-off FET circuit which requires only a small additional gating current for turn-on, due to additional resistor 26, but requires no reverse gating current for turn-off while still turning off rapidly.

Since the base of transistor 14 is connected to gate terminal 10, switch means 12 is biased OFF in response to gate drive to FET 4, to thus prevent draining of gate drive away from the FET gate during turn-on. Resistor 24 prevents high temperature leakage in transistor 16 from causing excessive current requirements into gate terminal 10.

Figure 2:
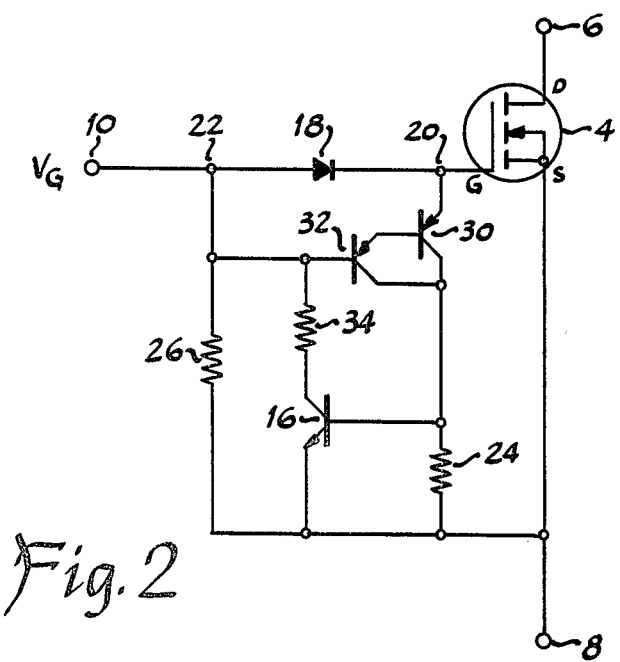
FIG. 2 is a circuit diagram showing an alternate embodiment of the circuit of FIG. 1.

FIG. 2 shows an alternate embodiment of the FET circuit of FIG. 1 and uses like reference numerals where appropriate to facilitate clarity. Bipolar transistor 14 is replaced by a Darlington transistor pair 30 and 32. Bipolar PNP transistor 30 has its emitter connected to point 20 and its collector connected to the base of transistor 16 and to source terminal 8 through resistor 24. Bipolar PNP transistor 32 has its emitter connected to the base of transistor 30, its base connected to point 22, and its collector connected to the collector of transistor 30.

Resistor 34 is added between the base of transistor 32 and the collector of transistor 16 to facilitate turn-on of FET 4 if needed before transistors 30, 32 and 16 have turned off. If gate drive is reapplied at terminal 10, resistor 34 diverts it to the base of transistor 32 to reverse bias the latter's emitter-base junction to turn it off and break the regenerative loop. If resistor 34 were not present, there would be a short circuit through transistor 16 from terminal 10 to terminal 8, which short would be maintained by the conduction of transistors 30 and 32. A large amount of gate drive would then be needed to cause a sufficient rise in the potential on the FET gate to turn the latter ON. Resistor 34 thus provides current limiting when the bipolar transistors 30, 32 and 34 are ON and still pulling charge out of the FET gate and it is desired to reapply gate drive to terminal 10 to turn the FET ON.

It is recognized that various modifications are possible within the scope of the appended claims.

I claim:

1. A fast turn-off FET circuit having drain, source and gate terminals, comprising:

an enhancement mode FET having a drain connected to said drain terminal, a source connected to said source terminal, and a gate operatively coupled to said gate terminal;

regenerative switch means connected to said FET gate and source and driven into latched conduction by residual stored charge in the gate to source capacitance of said FET upon turn-off of the latter due to removal of gate drive, said conduction of said regenerative switch means remaining latched ON until the charge on said FET gate is depleted to a given switching threshold, such that conduction of said regenerative switch means provides faster discharge therethrough of said FET gate, whereby to facilitate faster FET turn-off.

2. The invention according to claim 1 comprising gate biasing voltage source means for supplying gate drive to said gate terminal, and wherein said regenerative switch means comprises regeneratively coupled bipolar transistor means connected between said FET gate and said FET source, and biased OFF in response to gate drive to said FET to prevent draining of said gate drive away from said FET gate.

3. The invention according to claim 2 wherein said regeneratively coupled bipolar transistor means comprise first bipolar transistor means having one of its emitter and collector connected to said FET gate and having a base connected to said gate terminal, and second bipolar transistor means having one of its emitter and collector coupled to said base of said first bipolar transistor means and having the other of its emitter and collector connected to said FET source and having a base connected to the other of said emitter and collector of said first bipolar transistor means, such that the base drive for said second bipolar transistor means is supplied by conduction of said first bipolar transistor means and such that the base drive of said first bipolar transistor means is supplied by conduction of said second bipolar transistor means.

4. The invention according to claim 3 comprising a diode connected between said gate terminal and said FET gate, said base of said first bipolar transistor means and said one of said emitter and collector of said second bipolar transistor means being connected to a node connecting said gate terminal and said diode, and said one of said emitter and collector of said first bipolar transistor means being connected to a node connecting said diode and said FET gate, said diode being forward biased in response to gate drive to pass gate drive therethrough to drive said FET gate, said diode being reverse biased in response to gate to source capacitive voltage of said FET upon removal of gate drive whereby to block current flow through said diode between said FET gate and said base of said first bipolar transistor means and said one of said emitter and collector of said second bipolar transistor means and insure biasing of said regeneratively coupled bipolar transistor means into conduction.

5. The invention according to claim 4 comprising resistor means connected between said base of said first bipolar transistor means and said FET source, said resistor means being of a sufficient value to prevent significant diversion of gate drive from said gate terminal to said FET source and to provide a return path for biasing said first bipolar transistor means into conduction.

6. The invention according to claim 5 comprising second resistor means connected between said base of second bipolar transistor means and said FET source to prevent high temperature leakage in said second bipolar transistor means from causing excessive gate drive requirements into said gate terminal.

7. The invention according to claim 5 wherein said first bipolar transistor means comprises a Darlington connected transistor pair, and further comprising a resistor having one end connected to a node connecting said gate terminal and the base of said Darlington transistor pair, and having its other end connected to said one of said emitter and collector of said second bipolar transistor means, said last mentioned resistor facilitating turn-on of said FET if required before said regeneratively looped bipolar transistor means has turned off by diverting reapplied base drive to said base of said Darlington transistor pair to reverse bias the emitter-base junction of the latter to turn it off and break the regenerative loop, and preventing a short circuit through said second bipolar transistor means.

8. A fast turn-off FET circuit having drain, source and gate terminals comprising:

an n channel enhancement mode FET having a drain connected to said drain terminal, a source connected to said source terminal, and a gate operatively coupled to said gate terminal;

a diode having a cathode connected to said FET gate and an anode connected to said gate terminal;

a PNP bipolar transistor having its emitter connected to a node connecting said diode and said FET gate;

an NPN bipolar transistor having a collector connected to the base of said first bipolar transistor and connected in common therewith to a node connecting said gate terminal and said diode, the base of said NPN transistor connected to the collector of said PNP transistor, the emitter of said NPN transistor connected to said FET source.

9. The invention according to claim 8 comprising a resistor connected between said base of said PNP transistor and said FET source, said bipolar transistors forming a regenerative loop driven into latched conduction by residual stored charge in the gate to source capacitance of said FET upon turn-off of the latter due to removal of gate drive, said diode being reverse biased and the emitter-base junction of said PNP transistor being forward biased by said residual capacitively stored gate charge upon removal of gate drive, such that said PNP transistor is biased into conduction and supplies base drive to said NPN transistor to render the latter conductive which in turn latches base drive from said PNP transistor to complete said regenerative loop which remains conducting until said FET gate charge is depleted to a given switching threshold, such that latched conduction of said bipolar transistors provides faster discharge therethrough of said FET gate, whereby to facilitate faster FET turn-off, said connection of said base of said PNP transistor to said gate terminal causing said PNP transistor to be biased OFF in response to gate drive to said FET to prevent draining of said gate drive away from said FET gate, said reverse biased condition of said diode upon removal of gate drive causing said diode to block current flow therethrough from said FET gate to said base of said PNP transistor and insure biasing of said PNP transistor into conduction.

* * * * *